United States Patent [19]

Tsuda et al.

[11] 4,297,433

[45] Oct. 27, 1981

[54] LIGHT SENSITIVE COMPOSITIONS OF POLYMETHYL ISOPROPENYL KETONE

[75] Inventors: Minoru Tsuda, Isehara; Yoichi Nakamura, Samukawa, both of Japan

[73] Assignee: Tokyo Ohka Kogyo Kabushiki Kaisha, Kawasaki, Japan

[21] Appl. No.: 961,120

[22] Filed: Nov. 16, 1978

Related U.S. Application Data

[63] Continuation of Ser. No. 957,836, Nov. 6, 1978.

[30] Foreign Application Priority Data

Nov. 4, 1977 [JP] Japan .................... 52-132234

[51] Int. Cl.$^3$ .................... G03C 1/68; G03C 5/00
[52] U.S. Cl. .................... 430/270; 204/159.2; 430/296; 430/313; 430/326; 430/942; 430/923; 430/925; 430/926
[58] Field of Search ............... 430/270, 296, 313, 326, 430/323, 940, 942, 923, 925, 926; 204/159.2

[56] References Cited

U.S. PATENT DOCUMENTS 4,018,937  4/1977  Levine et al. .................... 430/296

OTHER PUBLICATIONS

Shultz, *Journal of Polymer Science*, vol. XLVII, pp. 267-276 (1960).
Wissbrun, *Journal of the American Chemical Society*, 81, 58, 1959, pp. 58-62.
Levine et al., "The Interaction of 5 KeV Electrons with Polymers of Methyl Isopropenyl Ketone," Oct. 24-26, 1973.
Kosar, "Light Sensitive Systems", Feb. 1966, pp. 139-304.

*Primary Examiner*—Edward C. Kimlin
*Attorney, Agent, or Firm*—Armstrong, Nikaido, Marmelstein & Kubovcik

[57] ABSTRACT

The present invention relates to a method for forming ultra fine patterns on films of polymethyl isopropenyl ketone or a mixture of polymethyl isopropenyl ketone and a benzophenone compound by exposing such films to ultra violet rays in the range of from 1,000 to 3,500 Å. The present invention is particularly useful for providing semiconductors having ultra fine patterns and ultra LSI's. The electric or electronic circuits for electronic or electric apparatus and equipment have been produced by wiring resistors, condensers, coils, vacuum tubes and the like necessary components. However, because of various disadvantages such as assembly requiring much time, complication of work, necessity of using large equipment, reasons or causes for errors, limitation of productivity, impossibility of reducing price or cost and the like, the present invention has been developed for printed circuit boards. However, in the present invention, such active devices as vacuum tubes, resistors, condensers, coils and the like must be fixed on printed circuit boards which have been previously finished. Therefore, although this invention has brought reduction, to some extent, in the time required for the work, complication of work, and the work capacity (scale), it can not yet be said that it has made the work miniaturized or economical. Under such circumstances, through the invention of diodes and transistors by solidification of rectification and amplifying functions in the form of germanium or silicone semiconductors, if has become possible to make the work extremely miniaturized.

1 Claim, No Drawings

LIGHT SENSITIVE COMPOSITIONS OF POLYMETHYL ISOPROPENYL KETONE

This application is a continuing application of prior application, Ser. No. 957,836, filed Nov. 6, 1978.

BACKGROUND OF THE INVENTION

Through further development of diodes and transistors in the form of semiconductor electronic and electric circuits have been solidified to be so-called Integrated Circuits (ICs). ICs are mainly made from silicon because of easy handling, rich resource and other good reasons. ICs have met the applicant's highest expectations for solidification of circuits, reduction of manpower, miniaturization, less trouble, economy by mass production and the like, and they are currently widely used in electronic and electric circuits, memories for computers, microcomputers and other components. In the manufacturing processes of such semiconductor devices as above, there is a technology called "photolithography". In photolithography, after having coated about 1 $\mu$ m thin film of a photoresist, which will become an etching resist, on a silicon wafer which has a silicon oxide film of several 1,000 Å, the film is exposed to ultraviolet rays through a mask and images are developed and etched. After having stripped off the photoresist, the wafer is completely cleaned, and dopants are diffused and implated from the exposed area of silicon. By repeating this photolithography several times and, furthermore, by preparing electrodes and wiring, ICs are manufactured. The working geometry or size of photolithography of diodes, transistors and early ICs produced rough figures as 100- scores of $\mu$m. Since then, after the superiority of solidified devices had been recognized, a further miniaturization has been made by adding the same functions and/or new functions, efforts were made for increasing the economical aspects, and development has been made for new demands. For this reason, together with the improvement and increase of mask performance, photoresist performance, quality of silicon wafers, performance of mask alignment equipments, diffusion techniques, performance of related chemicals, etching techniques and the like, it has become possible to work for the geometries of 10–4 $\mu$m with necessary working accuracy and resulted in the form of Large Scale Integrated Circuit (LSI).

As LSI continuously shows expected performance and economy as a solid device the development of Ultra LSI (commonly expressed as Very Large Scale Integrated Circuits) has recently become very active by making the working geometry of the lithography such that much finer patterns of more limited results of 3–1 $\mu$m or below 1 $\mu$m with necessary working accuracy can be produced.

In conventional photolithography, because ultra violet rays having wavelengths of from 3,500 to 4,500 Å are used they produce diffraction of light and other undesired phenomena, and it has been concluded that it would be impossible to form fine patterns of below 1 $\mu$m even if modification or improvements are made or with full utilization of high performance of conventional photolithography. Particularly in the case of mass production, the present invention can provide economical advantages and increase demand and it meets the subject purpose or object, but the extention of conventional techniques cannot provide mass production fine patterns of 1 $\mu$m.

In order to obtain resolution of below 1 $\mu$m by avoidance of light diffraction to solve the above problem, development is under progress for the application of various energy sources such as electron beam which has a much shorter wavelength than light (approximately 0.5 Å) and soft X rays (about 10 Å). To explain this development in detail, application of electron beams require large scale equipment which must be operated and used by large scale computers resulting in an extremely expensive system, and in addition to these disadvantages, although there are many available electron beam resists there is no acceptable one, it requires longer exposure times, and there is no practicality in the transfer of images onto the wafers. Furthermore, there is no practical light source (energy source) for application of soft X rays. It has a number of disadvantages such as mask-making is troublesome, mask-adjusting is difficult, there is a physiological dislike, extremely expensive equipment is anticiptated and others. For these reasons, a working technique for an economical mass production of 1 $\mu$m or below 1 $\mu$m geometry using energy of shorter wavelengths is still considerably difficult to be developed.

In order to solve such existing problems, through utilization of ultra violet rays having a shorter wavelength of from 1,000 to 3,500 Å than from 3,500 to 4,500 Å as used in the conventional photolithography, and a special photoresist such as Polymethyl Methacrylate (PMMA), it has been discovered that, by reduction of diffraction phenomenon, it is possible to obtain ultra high resolution and a highly accurate resist pattern of 1 $\mu$m down to below 1 $\mu$m.

However, although ultra fine patterns could be obtained with a single position exposure instead of using a scanning exposure, PMMA was in a disadvantageous position because of its considerably low sensitivity, lack of etching resistance, especially lack of resistance against plasma dry etching, therefore, it could not be used in practical applications.

Because of these reasons, if a photoresist having equivalent to or higher ultra resolution, sensitivity and etching resistance than PMMA against the light source with wavelengths of 1,000–3,500 Å, could be found, such a photoresist can be used in the technology of extended conventional photolithography and, in addition to such advantage, because low pressure mercury lamps, deutrium lamps, xenon-mercury lamps and the like, can be used as light sources and it becomes possible to solve the problems with the most economical formation of ultra finer patterns and its practicality.

With such background as mentioned above, the inventors of the present invention, as the result of their research and development, have invented a method to form extremely superior ultra fine patterns without having any one of the above-mentioned defects.

SUMMARY OF THE INVENTION

To explain it in brief, the inventors have found a completely new photoresist which can form ultra fine patterns by application of ultra violet rays having wavelength in the range of from 1,000 to 3,500 Å. The new photoresist is prepared from polymethyl isopropenyl ketone (PMIPK) which, has been found to have about 20 times higher sensitivity than PMMA when exposed to ultra violet rays having wavelengths of from 1,000 to 3,500 Å as well as ultra high resolution (it is dependable upon the quality of masks, but it can give ultra high resolution below 1 $\mu$m down to 0.4 $\mu$m –0.2 $\mu$m) equivalent to PMMA, and furthermore, another important property of dry-etching resistance is about 2-3 times higher than that of PMMA, making it a superior material.

Research has been made on the basic data of light degradation of PMIPK but nothing has been mentioned or nothing has been found at all on the method to form ultra fine patterns and properties to be used as etching resist, nothing has been mentioned or nothing has been found on the necessary information for the present invention such as a method to form ultra fine patterns and properties to be used as etching resist.

Although it has already been found that PMIPK is decomposed upon exposure to electron beams under a vacuum there was no knowledge about the possibility nor was any trial attempted to decompose PMIPK with ultra violet rays to form ultra fine patterns.

Furthermore, the inventors have also found that a mixture prepared by the addition of benzophenone derivatives to PMIPK will increase considerably the degree of sensitivity, reduce the degree of swelling during development, form more stable images and give much superior etching resistance; the inventors have completed the present invention based upon these discoveries.

DETAILED DESCRIPTION OF THE INVENTION

The present invention provides a process for forming an ultrafine pattern wherein a film of polymethyl isopropenyl ketone having a molecular weight of 10,000–1,000,000 (and dispersity index of below 3 which is an indication of the distribution of the molecular weight) is irradiated with ultraviolet rays having a wave length in the range of from 1,000 to 3,500 Å through a mask pattern and then it is subjected to a developing treatment.

The polymethyl isopropenyl ketone used as the principal component of the sensitive material according to the present invention is a polymer having a molecular weight of 10,000–1,000,000 and dispersity index of below 3 obtained by polymerizing methyl isopropenyl ketone. If this polymer is irradiated with ultraviolet rays having a wave length in the range of from 1,000 to 3,500 Å, it is decomposed and as a result, it becomes easily soluble in a solvent such as a mixture of cellasolone and cyclohexanone. The film thus prepared has a thickness of usually 0.3–1.0μ.

If the molecular weight of PMIPK of the present invention is lower than 10,000, it shows a poor film-forming property, while if it is more than 1,000,000 it shows a poor solubility in solvents; thus, it is quite inconvenient for handling and it is difficult to make thick films. For these reasons, it is more convenient and desirable to use PMIPK which has a molecular weight in the range of from 30,000 to 600,000. In order to obtain superior resolution, it is more advantageous to use PMIPK having a small distribution of molecular weight; in other words, the dispersity index (Mw/Mn in which Mw=weight-average molecular weight, and Mn=number-average molecular weight) which shows the distribution of molecular weight, is required to be below 3. It is desirable if it is below 2. When it is more than 3 or 4 the resolution will be definitely reduced. PMIPK with these properties, in case it is in complete contact with a mask, should have an ideal property whereby it shows no staining of the mask with tackiness of a regular photoresist or cracking caused by scratches or brittleness of the photoresist. This property is extremely advantageous in the forming of ultra fine patterns through increased yield in the work process and possibility of complete contact with a mask.

A light source used for the image-forming exposure according to the process of the present invention may be any light source which provides ultraviolet rays having a wave length in the range of from 1,000 to 3,500 Å, for example, a low pressure mercury lamp having a window of $MgF_2$, $SiO_2$ or LiF, a heavy hydrogen lamp or a xenon-mercury lamp. A mask pattern used in the image-forming exposure may be prepared by providing a desired pattern on a base made of LiF, $MgF_2$, $CaF_2$, $BaF_2$, $Al_2O_3$ or $SiO_2$ which transmits light having a wave length in the range of from 1,000 to 3,500 Å.

The image-forming exposure treatment is effected advantageously under vacuum or in an inert gas atmosphere. As the inert gas, there may be used, for example, nitrogen, helium, argon and xenon.

The image-forming exposure treatment is usually completed by irradiation for a period of time ranging from one second to five minutes, though the irradiation time depends on size and kind of light source, kind of the mask, molecular weight and dispersity index of below 3 of the polymethyl isopropenyl ketone and thickness of the film.

After the image-forming exposure treatment has been completed, the film is subjected to a developing treatment. The developing treatment is effected by washing with a solvent in which the decomposition product formed by the irradiation with ultraviolet rays of 1,000–3,500 Å is soluble, but in which the polymethyl isopropenyl ketone is insoluble, for example, a mixture of cellosolve or cyclohexanone. For the washing process, any means such as immersion, spraying or brushing can be employed.

More preferred results can be obtained by incorporating as a sensitizer a benzophenone compound of the general formula:

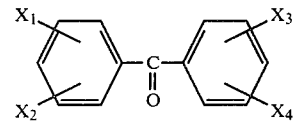

wherein $X_1$, $X_2$, $X_3$ and $X_4$ each represent a hydrogen atom, a halogen atom, a lower alkyl group, a lower alkoxy group or hydroxyl group in m- or p-position in the polymethyl isopropenyl ketone used as the sensitive material. As the benzophenone compounds, there may be employed, for example, benzophenone, 4-chlorobenzophenone, 4-bromobenzophenone, 2,4-dichlorobenzophenone, 2,4'-dichlorobenzophenone, 4,4'-dibromobenzophenone, 4-methylbenzophenone, 4,4'-dimethylbenzophenone and 4-hydroxybenzophenone. Among them, 4,4'-dibromobenzophenone is particularly preferred. The benzophenone compounds may be used either alone or in the form of a combination of two or more of them. The amount of the benzophenone compound(s) is usually selected in the range of from 1–25 parts by weight per 100 parts by weight of the polymethyl isopropenyl ketone. The incorporation of the benzophenone compound brings about the advantages that a strong developing solution can be used and etching resistance of the film is improved, since wetting in the developing step is reduced. In drying the film, if a high temperature heat drying process is employed, the sensitizing effect of the benzophenone compound cannot be exhibited sufficiently sometimes. In such a case, the film is treated with a vapor of a solvent compatible with the polymethyl isopropenyl ketone such as the vapor of cyclohexanone or. As a matter of course, such a problem is not caused in a low temperature drying process. Further, some benzophenone compounds, for example, 4,4'-dibromobenzophenone, exhibit a complete sensitizing effect even if it is dried at a high temperature.

According to a preferred embodiment of the present invention, a solution of polymethyl isopropenyl ketone or a mixture of polymethyl isopropenyl ketone and a benzophenone compound of the above general formula in a suitable solvent such as cyclohexanone is applied to a base such as a silicon wafer, dried to form a resist layer of a thickness of 0.3-$\mu$, subjected to an image-forming exposure treatment with a sterilization lamp which emits an ultraviolet ray having a wave length of 2537 Å and then subjected to a baking treatment to remove the solvent from the resist layer. Therefore, it is immersed in a developer such as a mixture of cellosolve or cyclohexanone to elute the exposed part, thereby obtaining a very minute pattern.

Thus, according to the present invention, submicron patterns can be formed in a short period of time by using a light source easily available on the market at a low price such as a heavy hydrogen lamp or low pressure mercury lamp (sterilization lamp). Further, the patterns thus obtained are sufficiently resistant to etching caused by hydrofluoric acid or the like.

Moreover, since it can resist plasma dry etching which is an inevitable process in the etching of ultra fine patterns, it can be suitably utilized in the fabrication (manufacture) of ultra LSI.

The following examples further illustrate the present invention.

EXAMPLE 1

100 Parts by weight of polymethyl isopropenyl ketone of a molecular weight of 800 and dispersity index of 1.7 were dissolved in cyclohexanone to obtain a solution of a concentration of 10 weight %. 10 Parts by weight of a benzophenone compound shown in Table 1 were added to the solution and the mixture was subjected to filtration through a filter of 0.2$\mu$ to obtain a sensitizing solution. The sensitizing solution was then applied to a silicon wafer with a spinner. A resist layer of a thickness of about 0.5$\mu$ was formed thereon and the whole was dried in a desiccator under reduced pressure for about two hours. The resulting sensitive material was exposed stepwise from a distance of 5 cm to a commercial sterilization lamp emitting an ultra-violet ray having a wave length of 2537 A. After exposure, it was subjected to a baking treatment at 80° C. for 40 minutes to remove the solvent completely from the resist layer.

Then, the silicon wafer was immersed in a developing solution comprising ethyl cellosolve and cyclohexanone in a proportion of 7:3 for one minute to effect the development and subsequently washed with water for one minute. Sensitivity was determined from the number of residual steps. The results are shown in Table 1. Relative sensitivity in the table is a relative value based on sensitivity (10) of pre-baked polymethyl isopropenyl ketone.

TABLE 1

| No. | Benzophenone compound | Relative sensitivity |
|---|---|---|
| 1 | None | 10 |
| 2 | Benzophenone | 18 |
| 3 | 4-Chlorobenzophenone | 18 |
| 4 | 4-Bromobenzophenone | 14 |
| 5 | 2,4-Dichlorobenzophenone | 18 |
| 6 | 2,4'-Dichlorobenzophenone | 14 |
| 7 | 4,4'-Dichlorobenzophenone | 18 |
| 8 | 4,4'-Dibromobenzophenone | 35 |
| 9 | 4-Methylbenzophenone | 18 |
| 10 | 4,4'-Dimethylbenzophenone | 18 |
| 11 | 4-Hydroxybenzophenone | 12 |
| 12 | 4,4'-Dihydroxybenzophenone | 12 |

It has been found that 4,4-dibromobenzophenone of No. 8 in the above list, is especially effective. Example 2

A resist layer comprising 100 parts by weight of polymethyl isopropenyl ketone and 10 parts by weight of 4,4'-dibromobenzophenone was prepared under the same conditions as in Example 1. Baking treatment was effected at various temperatures for various periods of time. The results are shown in Table 2.

TABLE 2

| No. | Baking condition Temperature (°C.) | Time (minute) | Relative sensitivity |
|---|---|---|---|
| 1 | 80 | 20 | 35 |
| 2 | 80 | 40 | 35 |
| 3 | 85 | 40 | 35 |
| 4 | 90 | 40 | 35 |
| 5 | 100 | 40 | 35 |

It is apparent from the above table that the resist layer is not changed in sensitivity by the baking treatment.

EXAMPLE 3

A resist layer comprising the same polymethyl isopropenyl ketone and benzophenone compound as in Example 1 was prepared. It was subjected to a baking treatment at 80° C. for 40 minutes and then to exposure treatment with the same sterilization lamp as in Example 1. Sensitivity of the product was determined. The results are shown in Table 3. Separately, the baked resist layer was contacted with cyclohexanone vapor at 80° C. for 10 seconds and then subjected to the exposure treatment. Sensitivity thereof was determined to obtain the same results as in Table 1. In other words, even if the sensitivity was lowered once by the baking treatment, except for the case of using 4,4'-dibromobenzophenone, the sensitivity could be recovered by treating the film with an excellent solvent such as cyclohexanone.

TABLE 3

| No. | Sensitizer | Relative sensitivity After baking | After treatment with solvent vapor |
|---|---|---|---|
| 1 | None | 10 | 10 |
| 2 | Benzophenone | 12 | 18 |
| 3 | 4-Chlorobenzophenone | 10 | 18 |
| 4 | 4-Bromobenzophenone | 10 | 14 |
| 5 | 2,4-Dichlorobenzophenone | 10 | 18 |
| 6 | 2,4'-Dichlorobenzophenone | 10 | 14 |
| 7 | 4,4'-Dichlorobenzophenone | 12 | 18 |
| 8 | 4,4'-Dibromobenzophenone | 35 | 35 |
| 9 | 4-Methylbenzophenone | 12 | 18 |
| 10 | 4,4'-Dimethylbenzophenone | 10 | 18 |
| 11 | 4-Hydroxybenzophenone | 9 | 12 |

TABLE 3-continued

| No. | Sensitizer | Relative sensitivity | |
|---|---|---|---|
| | | After baking | After treatment with solvent vapor |
| 12 | 4,4'-Dihydroxybenzophenone | 9 | 12 |

It is apparent from the above table that sensitivity is reduced after the baking treatment, except for the case of using 4,4'-dibromobenzophenone but the sensitivity could be recovered by the solvent vapor treatment.

Example 4

10 Parts by weight of 4,4'-dibromobenzophenone, per 100 parts by weight of polymethyl isopropenyl ketone, were added to a 10 weight % solution of polymethyl isopropenyl ketone of a molecular weight of 500,000 and dispersity index of 1.8 in cyclohexanone to obtain a sensitizing solution. The sensitizing solution was applied to a silicon wafer in the same manner as in Example 1 and then baked at 80° C. for 20 minutes to obtain a resist layer of a thickness of about $0.5\mu$. Thereafter, a quartz mask pattern was applied closely to the resist layer. After exposure to a light emitted by the same sterilization as in Example 1 for one minute, it was immersed in the same developing solution as in Example 1 for one minute to effect the development. After washing with water for one minute followed by drying, a very accurate pattern of a width of $0.5\mu$ was obtained.

The silicon wafer having the formed pattern was baked at 170° C. for one hour and then treated with an etching solution containing hydrogen fluoride and ammonium fluoride (weight ratio 1:6) for 7 minutes.

Thus, an etching pattern matching the mask pattern was obtained.

EXAMPLE 5

A photoresist prepared by dissolving PMIPK having a molecular weight of 200,000 and dispersity index of 2.3 in cychlohexanone was pre-baked for 20 minutes at 110° C. and spin-coated in such a way that a film thickness of 0.5 $\mu$m was obtained in the same way as for practical example No. 1.

A comparison was made to see if this film can resist plasma dry etching which is an inevitable and important property required in the etching of ultra fine patterns, compared with the 0.5 $\mu$m film of the aforementioned PMMA (molecular weight: 1,000,000) also coated on a silicone wafer. The etching machine used in this comparison, was a wafer-fed precision plasma etching machine (Tokyo Ohka's Ohka Automatic Plasma Machine [OAPM]) which is one of the best equipment available at present.

In the working geometry for highly accurate memories, patterns of 2–4 $\mu$m are etched, but in case of poly silicone a thickness of 3,000–5,000 Å and in case of silicone nitride a thickness of 1,000–1,200 Å are generally used. The etching of these thicknesses, with use of OAPM, can be completed with such an accuracy that a slight under-cut can be ignored, in about 40 seconds in case of poly silicon of 3,500 Å and about 60 seconds in case of silicon nitride of 1,200 Å respectively under conditions of RF (high frequency) output: 200 W, etching gas: $CF_4$ (95%) + $O_2$ (5%) with 1 l/min. flow, wafer temperature: 130° C., vacuum: 0.5 Torr.

The aforementioned PMIPK and PMMA were spin-coated onto wafers and tested for etching resistance for comparison purposes. The results are shown in the following table.

| | Reduction of film thickness | | |
|---|---|---|---|
| | 1 min. | 2 min. | 3 min. |
| (1) PMMA | 0.125 $\mu$m | 0.206 $\mu$m | 0.290 $\mu$m |
| (2) PMIPK | 0.008 $\mu$m | 0.064 $\mu$m | 0.112 $\mu$m |
| (1)/(2) | 15.6 | 3.2 | 2.6 |

Judging from the result of this test, it has been found that PMIPK when it is plasma-etched with OAPM showed almost equal reduction of film thickness (0.12 $\mu$m/3 min) as well as the photoresists (cyclized rubber type) used for fabrication of semiconductors and is very close of 0.08 $\mu$m/3 min. of the best positive type photoresist, and it can be successfully used in the practical application while PMMA can not be used in practical application because it showed extremely more reduction in film thickness with uncertainty of its performance.

EXAMPLE 6

The same PMIPK photoresist was spin-coated to form a 0.5 $\mu$m thickness as used in example No. 1, on a wafer having silicon nitride (SiN) of 1,000 Å on the surface of $SiO_2$ over a silicon wafer. After treatment as in example No. 1, and processing as in example No. 4, a window pattern of 0.4 $\mu$m was obtained with good accuracy. The same photoresist was etched on aforementioned SiN with a wafer-fed precision plasma etching equipment (such a Tokyo Ohka's OAPM-300) under the following conditions:

RF output: 200 W
Gas: $CF_4$ 1.0 l + $O_2$ 50 ml (5%)
Vacuum: 0.55 Torr.
Temperature: 120° C.

Etching of SiN of 1,000 Å was completed in an actual etching time of 30 seconds. The results show that the PMIPK photoresist can resist etching and provides ideal etching without any side-etching.

What is claimed is:

1. An ultraviolet ray-sensitive composition comprising polymethyl isopropenyl ketone having a molecular weight of 10,000–1,000,000 and a dispersity index of below 3 and 4,4'-dibromobenzophenone, the amount of the benzophenone being 1–25 parts by weight per 100 parts by weight of the polymethyl isopropenyl ketone.

* * * * *

UNITED STATES PATENT AND TRADEMARK OFFICE
CERTIFICATE OF CORRECTION

PATENT NO. : 4,297,433
DATED : October 27, 1981
INVENTOR(S) : MINORU TSUDA ET AL It is certified that error appears in the above-identified patent and that said Letters Patent are hereby corrected as shown below:

IN THE ABSTRACT:

1) In line 3 from the bottom, change "silicone" to --silicon--.

2) In column 1, line 29, after "implated", change "from" to --into--.
3) In column 2, line 8, change "require" to --requires--.
4) In column 3, line 46, change "cellasolone" to --cellosolve--.
5) In column 3, line 48, change "0.3-10μ" to --0.3-1.0μm--.
6) In column 4, line 34, after "cellosolve", change "or" to --and--.
7) In column 5, line 5, after "or", insert --cellulolve acetate--.
8) In column 5, line 18, change "0.3-μ" to --0.3-1.0μm--.
9) In column 5, line 23, after "cellosolve", change "or" to --and--.
10) In column 5, line 43, change "800" to --800,000--.
11) In column 5, line 48, change "0.2μ" to --0.2μm--.
12) In column 5, line 51, change "0.5μ" to --0.5μm--.
13) In column 5, line 56, change "2537 A" to --2537 Å--.
14) In column 6, line 16, change "4,4-dibromobenzophenone" to --4,4'-dibromobenzophenone--.

UNITED STATES PATENT AND TRADEMARK OFFICE
CERTIFICATE OF CORRECTION

PATENT NO. : 4,297,433
DATED : October 27, 1981
INVENTOR(S) : MINORU TSUDA ET AL It is certified that error appears in the above-identified patent and that said Letters Patent are hereby corrected as shown below:

15) In column 6, lines 17-18, delete "Example 2" and insert --EXAMPLE 2-- into the center position of the next interlinear space.

16) In column 7, line 13, capitalize each letter of the word "Example".

17) In column 7, line 23, change "$0.5\mu$" to --$0.5\mu m$--.

18) In column 7, lines 25-26, after "sterilization", insert --lamp--.

19) In column 7, line 30, change "$0.5\mu$" to --$0.5\mu m$--.

20) In column 7, lines 39-44, delete "A photoresist ... example No. 1." and insert therefor --A photoresist prepared by dissolving PMIPK having a molecular weight of 200,000 and dispersity index of 2.3 in cyclohexanone was spin-coated on a silicon wafer in the same manner as in Example 1 and then pre-bake at 110°C. for 20 minutes to obtain a resist layer of thickness of $0.5\mu m$.--

21) In column 7, line 50, change "silicone" to --silicon--.
22) In column 7, line 57, change "silicone" to --silicon--.
23) In column 7, line 58, change "silicone" to --silicon--.

UNITED STATES PATENT AND TRADEMARK OFFICE
CERTIFICATE OF CORRECTION

PATENT NO. : 4,297,433
DATED : October 27, 1981
INVENTOR(S) : MINORU TSUDA ET AL It is certified that error appears in the above-identified patent and that said Letters Patent are hereby corrected as shown below:

24) In column 8, line 34, change "example No. 1" to --Example 1--.
25) In column 8, line 37, change "example No. 1" to --Example 1--.
26) In column 8, line 37, change "example No. 4" to --Example 4--.
27) In column 8, line 41, change "such a" to --such as--.

Signed and Sealed this

Twenty-fifth Day of May 1982

[SEAL]

Attest:

Attesting Officer

GERALD J. MOSSINGHOFF
*Commissioner of Patents and Trademarks*